(12) United States Patent
Kim et al.

(10) Patent No.: US 11,107,866 B2
(45) Date of Patent: Aug. 31, 2021

(54) ARRAY TEST APPARATUS AND METHOD

(71) Applicant: Samsung Display Co. Ltd., Yongin (KR)

(72) Inventors: Joon Geol Kim, Suwon-si (KR); Si Joon Kim, Seoul (KR); Hee Seon Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/725,280

(22) Filed: Dec. 23, 2019

(65) Prior Publication Data

US 2020/0135815 A1   Apr. 30, 2020

Related U.S. Application Data

(62) Division of application No. 15/017,742, filed on Feb. 8, 2016, now Pat. No. 10,553,659.

(30) Foreign Application Priority Data

Aug. 5, 2015  (KR) ........................ 10-2015-0110491

(51) Int. Cl.
*G01R 31/00* (2006.01)
*H01L 27/32* (2006.01)
(Continued)

(52) U.S. Cl.
CPC .......... *H01L 27/3244* (2013.01); *G09G 3/00* (2013.01); *G09G 3/006* (2013.01); *G09G 3/3233* (2013.01); *G09G 2300/0819* (2013.01); *G09G 2300/0842* (2013.01); *G09G 2300/0861* (2013.01); *G09G 2330/10* (2013.01)

(58) Field of Classification Search
USPC .............. 324/760.02, 762.02, 762.07, 762.1; 345/173, 211, 212
See application file for complete search history.

(56) References Cited

U.S. PATENT DOCUMENTS

2004/0184618 A1* 9/2004 Bengtsson ........... A61B 5/0002
                                                            381/60
2012/0056869 A1   3/2012 Cha et al.
(Continued)

FOREIGN PATENT DOCUMENTS

KR       101129195       3/2012
KR       101137426       4/2012
(Continued)

*Primary Examiner* — Vincent Q Nguyen
(74) *Attorney, Agent, or Firm* — Cantor Colburn LLP

(57) ABSTRACT

An array test apparatus includes a signal transmission unit which transmits a data signal to each of a plurality of data lines of a low-temperature polysilicon ("LTPS") substrate, a signal measurement unit which measures the data signal of each of the data lines of the LTPS substrate, a timer which generates a horizontal period for setting a section in which the data signal is transmitted from the signal transmission unit to each of the data lines and a section in which the data signal output from each of the data lines is measured by the signal measurement unit, and a determination unit which determines whether each of the data lines of the LTPS substrate is normal based on the data signal measured by the signal measurement unit.

11 Claims, 18 Drawing Sheets

(51) Int. Cl.
*G09G 3/3233* (2016.01)
*G09G 3/00* (2006.01)

(56) References Cited

U.S. PATENT DOCUMENTS

| | | |
|---|---|---|
| 2013/0271440 A1 | 10/2013 | Jin et al. |
| 2014/0197744 A1 | 7/2014 | Choi et al. |
| 2014/0285462 A1* | 9/2014 | Lee ................. G06F 3/0416 |
| | | 345/173 |

FOREIGN PATENT DOCUMENTS

| | | |
|---|---|---|
| KR | 101191343 | 10/2012 |
| KR | 101234088 | 2/2013 |
| KR | 1020130104563 | 9/2013 |
| KR | 101385919 | 4/2014 |
| KR | 1020150042573 | 4/2015 |

\* cited by examiner

ARRAY TEST APPARATUS AND METHOD

This application is a divisional of U.S. patent application Ser. No. 15/017,742, filed on Feb. 8, 2016, which claims priority to Korean Patent Application No. 10-2015-0110491, filed on Aug. 5, 2015, and all the benefits accruing therefrom under 35 U.S.C. § 119, the content of which in its entirety is herein incorporated by reference.

BACKGROUND

1. Field

Exemplary embodiments of the invention relate to an array test apparatus and method, and more particularly, to an array test apparatus and method for a display device including an organic light-emitting diode.

2. Description of the Related Art

Of display devices, an organic light-emitting display device is a display device that displays information such as images, characters, etc. using light generated when holes and electrons respectively from an anode and a cathode combine together in an organic layer located between the anode and the cathode.

The organic light-emitting display device does not require a light source due to their self-luminous characteristics. In addition, the organic light-emitting display device has various advantages such as low power consumption, high luminance, and high response speed. Due to such advantages, the organic light-emitting display device is drawing attention as a next-generation display device.

In an organic light-emitting display device, a supply of a driving current to an organic light-emitting diode ("OLED") is controlled by transistors that constitute each pixel circuit. However, when a pixel circuit fails to operate properly or when a line is cut or short-circuits, the driving current cannot be properly delivered to the organic light-emitting diode, causing the organic light-emitting diode to malfunction. For this reason, lines may be tested before the formation of the organic light-emitting diode to detect whether the lines operate normally (whether the lines are not cut or short-circuit) and repair defective lines. This is advantageous in terms of manufacturing time and cost.

Therefore, there is an urgent need for an array test apparatus and method for testing whether a pixel circuit array operates normally before the formation of an organic light-emitting diode. Here, the array test apparatus tests arrays that constitute an organic light-emitting display device after the completion of a low-temperature polysilicon ("LTPS") process of the organic light-emitting display device.

SUMMARY

Since an array test apparatus has to test arrays that constitute an organic light-emitting display device before the formation of organic light-emitting diodes, it is beneficial to detect abnormal arrays by measuring voltages or currents instead of measuring light emission.

Exemplary embodiments of the invention provide an array test apparatus which can detect abnormal arrays by measuring voltages or currents only.

Exemplary embodiments of the invention also provide a method of easily and quickly testing a plurality of arrays included in an organic light-emitting display device.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, an array test apparatus includes a signal transmission unit which transmits a data signal to each of a plurality of data lines of a low-temperature polysilicon ("LTPS") substrate, a signal measurement unit which measures the data signal of each of the data lines of the LTPS substrate, a timer which generates a horizontal period for setting a section in which the data signal is transmitted from the signal transmission unit to each of the data lines and a section in which the data signal output from each of the data lines is measured by the signal measurement unit and a determination unit which determines whether each of the data lines of the LTPS substrate is normal based on the data signal measured by the signal measurement unit. And where the data signal transmitted to each of the data lines is one of a first data voltage and a second data voltage, where the first data voltage and the second data voltage have different values. Also, the apparatus further includes a selection unit which selects whether the data signal to be transmitted to each of the data lines is the first data voltage or the second data voltage, where the LTPS substrate further includes a plurality of scan lines which intersect the data lines, and the horizontal period is a period of time during which a scan signal is transmitted to one of the scan lines on the LTPS substrate.

In an exemplary embodiment, the apparatus may further include a selection unit which selects the first data voltage or the second data voltage in each horizontal period, where the signal transmission unit transmits data signals in a first section of the horizontal period, and the signal measurement unit measures the data signals in a section remaining after the first section is excluded from the horizontal period, where when determining a measured data signal to be abnormal, the determination unit detects the location of an abnormal pixel based on the location of a data line in which the abnormal data signal was measured and the location of a scan line to which the scan signal was transmitted, where the determination unit stores an average value of the measured data signals and determines a data signal measured by the signal measurement unit to be normal when the measured data signal is within a predetermined threshold range from the stored average value and determines the data signal measured by the signal measurement unit to be abnormal when the measured data signal is outside the predetermined threshold range from the stored average value, where when data signals measured in each horizontal period are normal, the determination unit updates the average value of the measured data signals by including the data signals.

In an exemplary embodiment, the signal transmission unit may transmit an alternating current ("AC") data signal, where the signal measurement unit measures the AC data signal when a phase of the AC data signal is changed.

In an exemplary embodiment, the apparatus may further include a transmission probe which delivers a data signal transmitted from the signal transmission unit to each of the data lines, and a measurement probe which delivers the data signal measured in each of the data lines to the signal measurement unit, where the transmission probe and the measurement probe are placed above the data lines of the LTPS substrate to perform an array test.

According to an exemplary embodiment of the invention, an array test method includes selecting one of a first data voltage and a second data voltage to be applied to each of a plurality of data lines of an LTPS substrate including a plurality of pixels which are defined by the intersection of the data lines and a plurality of scan lines, transmitting a scan signal sequentially to the scan lines, applying the selected data voltage to each of the data lines, measuring a data signal of each of the data lines, and determining whether a data line disposed in each of the pixels is normal based on the measured data signal, and where a horizontal period is a section in which the scan signal is transmitted to one of the scan lines, and the data voltage to be applied to each of the data lines is selected from the first data voltage and the second data voltage in each horizontal period.

In an exemplary embodiment, the determining whether the data line disposed in each of the pixels is normal based on the measured data signal may include, calculating an average value of the measured data signals, determining the data line to be normal when a measured data signal is within a predetermined threshold range from the average value of the measured data signals and determining the data line to be abnormal when the measured data signal is outside the predetermined threshold range from the average value of the measured data signals.

In an exemplary embodiment, where the determining of the data line to be abnormal when the measured data signal is outside the predetermined threshold range from the average value of the measured data signals may further include detecting the location of an abnormal pixel based on the location of the data line which was determined to be abnormal and the location of a scan line to which the scan signal was transmitted.

According to an exemplary embodiment of other invention, an array test method includes applying an AC data voltage to each of a plurality of data lines of an LTPS substrate including a plurality of pixels which are defined by the intersection of the data lines and a plurality of scan lines, transmitting a scan signal sequentially to the scan lines, measuring a data signal of each of the data lines, and determining whether a data line disposed in each of the pixels is normal based on the measured data signal.

In an exemplary embodiment, where the measuring of the data signal of each of the data lines is performed when a phase of the AC data voltage applied to each of the data lines is changed.

BRIEF DESCRIPTION OF THE DRAWINGS

The above and other exemplary embodiments and features of the invention will become more apparent by describing in detailed exemplary embodiments thereof with reference to the attached drawings, in which.

DETAILED DESCRIPTION

Figure 1:
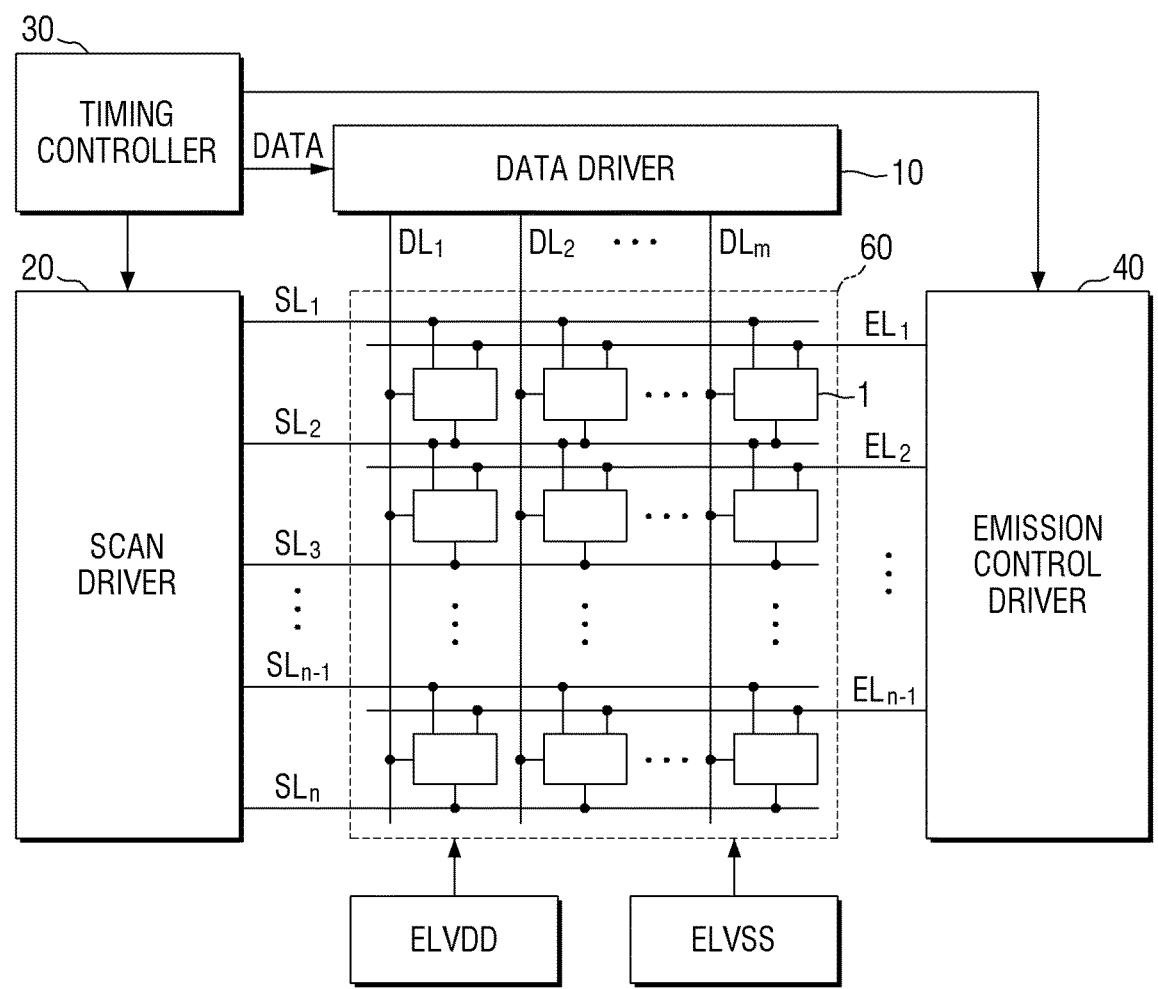
FIG. 1 is a block diagram of a general organic light-emitting display device.

Advantages and features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the attached drawings.

FIG. 1 is a block diagram of a general organic light-emitting display device.

Referring to FIG. 1, the organic light-emitting display device includes a display unit 60, a scan driver 20, a data driver 10, an emission control driver 40, and a timing controller 30.

The display unit 60 is a display panel which includes a plurality of pixels connected to a plurality of scan lines $SL_1$ through $SL_n$ and a plurality of data lines $DL_1$ through $DL_m$. Each of the pixels displays an image corresponding to an image data signal transmitted thereto.

The pixels included in the display unit 60 are connected to the scan lines $SL_1$ through $SL_1$ and the data lines to be arranged in substantially a matrix pattern. The scan lines $SL_1$ through $SL_n$ extend in substantially a row direction and almost parallel to each other. The data lines $DL_1$ through $DL_m$ extend in substantially a column direction and almost parallel to each other. Each of the pixels included in the display unit 60 receives a power supply voltage, i.e., a first driving voltage ELVDD and a second driving voltage ELVSS.

The scan driver 20 is connected to the display unit 60 by the scan lines $SL_1$ through $SL_n$. The scan driver 20 generates a plurality of scan signals that may activate the pixels in response to a scan control signal and transmits the scan signals to corresponding ones of the scan lines $SL_1$ through $SL_n$.

The scan control signal is an operation control signal for the scan driver 20 and generated by the timing controller 30.

The scan control signal may include a scan start signal, a clock signal, etc. The scan start signal is a signal that generates a first scan signal for displaying an image of one frame. The clock signal is a synchronization signal for sequentially transmitting the scan signals to the scan lines $SL_1$ through $SL_n$.

The scan driver 20 generates a plurality of scan signals $S_1$ through $S_n$ (refer to FIG. 2) in response to a driving control signal received from the timing controller 30. The scan driver 20 sequentially transmits the scan signals $S_1$ through $S_n$ of a gate-on voltage to the scan lines $SL_1$ through $SL_n$.

The data driver 10 is connected to the pixels of the display unit 60 by the data lines $DL_1$ through $DL_m$. The data driver 10 receives an image data signal DATA and transmits the image data signal DATA to corresponding ones of the data lines $DL_1$ through $DL_m$ in response to a data control signal.

The data control signal is an operation control signal for the data driver 10 and generated by the timing controller 30.

The data driver 10 selects gray voltages according to the image data signal DATA and applies the gray voltages to the data lines DU through $DL_m$ as data signals. The data driver 10 transmits a plurality of data signals $D_1$ through $D_m$ to the data lines $DL_1$ through $DL_m$, respectively. The data driver 10 transmits the data signals $D_1$ through $D_m$ having a predetermined voltage range to the data lines $DL_1$ through $DL_m$ in response to the scan signals $S_1$ through $S_n$ of the gate-on voltage.

The emission control driver 40 is connected to the display unit 60 by a plurality of emission control lines $EL_1$ through $EL_{n-1}$. The emission control driver 40 generates a plurality of emission signals that may control the pixels to emit light in response to an emission control signal and transmits the emission signals to corresponding ones of the emission control lines $EL_1$ through $EL_{n-1}$.

Figure 2:
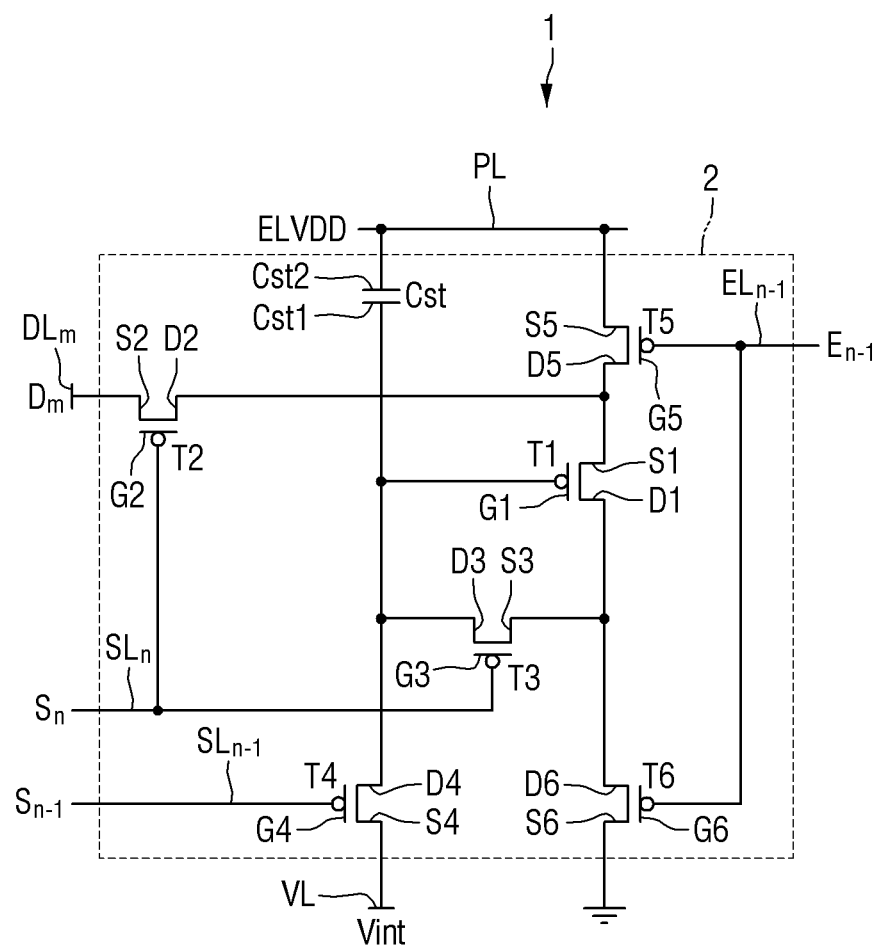
FIG. 2 is a circuit diagram of a pixel of a low-temperature polysilicon ("LTPS") substrate applied to the organic light-emitting display device.

FIG. 2 is an equivalent circuit diagram of a pixel of a low-temperature polysilicon ("LTPS") substrate applied to the organic light-emitting display device of FIG. 1. The LTPS substrate is a substrate having a plurality of data lines $DL_1$ through $DL_m$, a plurality of scan lines $SL_1$ through $SL_n$ and a plurality of emission control lines $EL_1$ through $EL_{n-1}$. A general organic light-emitting diode ("OLED") goes through a process of forming an organic layer, a cathode, an anode, etc. after an LTPS process. An array test apparatus and method according to an exemplary embodiment of the invention are used for an LTPS substrate applied to an organic light-emitting display device. Therefore, the operation, layout and manufacturing process of the LTPS substrate will be described with reference to FIGS. 2 through 7.

First, the operation of the LTPS substrate will be described with reference to FIG. 2. A pixel 1 illustrated in FIG. 2 is one of a plurality of pixels included in an $n^{th}$ row. The pixel 1 is connected to a scan line $SL_n$ corresponding to the $n^{th}$ row and a scan line $SL_{n-1}$ corresponding to an $(n-1)^{th}$ row before the $n^{th}$ row. In FIG. 2, each pixel 1 is connected to a scan line corresponding to a corresponding row and a scan line corresponding to a previous row of the corresponding row. However, the invention is not limited to this example, and each pixel 1 may be connected to any two scan lines of the scan lines $SL_1$ through $SL_n$.

The pixel 1 of the LTPS substrate includes a pixel circuit 2 having a plurality of thin-film transistors ("TFTs") T1 through T6 and a capacitor Cst. The pixel 1 will further include an OLED which emits light when receiving a driving current through the pixel circuit 2.

The TFTs T1 through T6 include a driving transistor T1, a switching TFT T2, a compensation TFT T3, an initialization TFT T4, a first emission control TFT T5, and a second emission control TFT T6.

The pixel 1 includes a first scan line $SL_n$ which delivers a first scan signal $S_n$ to the switching TFT T2 and the compensation TFT T3, a second scan line $SL_{n-1}$ which delivers a second scan signal $S_{n-1}$, which is a previous scan signal of the first scan signal $S_n$, to the initialization TFT T4, an emission control line $EL_{n-1}$ which delivers an emission control signal $E_{n-1}$ to the first emission control TFT T5 and the second emission control TFT T6, a data line $DL_m$ which intersects the first scan line $SL_n$ and delivers a data signal $D_m$, a driving voltage line PL which delivers a first power supply voltage ELVDD and extends almost parallel to the data line $DL_m$, and an initialization voltage line VL which delivers an initialization voltage Vint for initializing the driving TFT T1 and extends almost parallel to the second scan line $SL_{n-1}$.

A gate electrode G1 of the driving TFT T1 is connected to a first electrode Cst1 of the capacitor Cst. A source electrode S1 of the driving TFT T1 is connected to the driving voltage line PL via the first emission control TFT T5. A drain electrode D1 of the driving TFT T1 is electrically connected to an anode of the OLED via the second emission control TFT T6.

The array test apparatus and method according to the exemplary embodiment of the invention is an apparatus and method for testing a display device before the formation of the anode of the OLED and after the LTPS process. Hence, the OLED is not illustrated in FIG. 2. That is, the apparatus test apparatus and method according to the invention is an apparatus and method for testing arrays without measuring the degree of light emission of a display device.

The driving TFT T1 receives the data signal $D_m$ according to a switching operation of the switching TFT T2 and supplies a driving current to the OLED. Since FIG. 2 illustrates the pixel 1 before the formation of the OLED, the driving current flows to the ground.

A gate electrode G2 of the switching TFT T2 is connected to the first scan line $SL_n$. The source electrode S2 of the switching TFT T2 is connected to the data line $DL_m$. A drain electrode D2 of the switching TFT T2 is connected to the source electrode S1 of the driving TFT T1 and connected to the driving voltage line PL via the first emission control TFT T5. The switching TFT T2 is turned on by the first scan signal $S_n$ received through the first scan line $SL_n$ and performs a switching operation to deliver the data signal $D_m$ transmitted to the data line $DL_m$ to the source electrode $S_1$ of the driving TFT T1.

A gate electrode G3 of the compensation TFT T3 is connected to the first scan line $SL_n$. A source electrode S3 of the compensation TFT T3 is connected to the drain electrode D1 of the driving TFT T1 and a drain electrode D6 of the second emission control TFT T6. A drain electrode D3 of the compensation TFT T3 is connected to the first electrode Cst1 of the capacitor Cst, a drain electrode D4 of the initialization TFT T4, and the gate electrode G1 of the driving TFT T1. The compensation TFT T3 is turned on by the first scan signal $S_n$ received through the first scan line $SL_n$ and diode-connects the driving TFT T1 by connecting the gate electrode G1 and the drain electrode D1 of the driving TFT T1.

A gate electrode G4 of the initialization TFT T4 is connected to the second scan line $SL_{n-1}$. A source electrode S4 of the initialization TFT T4 is connected to the initialization voltage line VL. The drain electrode D4 of the initialization TFT T4 is connected to the first electrode Cst1 of the capacitor Cst, the drain electrode D3 of the compensation TFT T3 and the gate electrode G1 of the driving TFT T1. The initialization TFT T4 is turned on by the second scan signal $S_{n-1}$ received through the second scan line $SL_{n-1}$ and initializes a voltage of the gate electrode G1 of the driving TFT T1 by delivering an initialization voltage Vint to the gate electrode G1 of the driving TFT T1.

A gate electrode G5 of the first emission control TFT T5 is connected to the emission control line $EL_{n-1}$. A source electrode S5 of the first emission control TFT T5 is connected to the driving voltage line PL. A drain electrode D5 of the first emission control TFT T5 is connected to the source electrode $S_1$ of the driving TFT T1 and the drain electrode D2 of the switching TFT T2.

A gate electrode G6 of the second emission control TFT T6 is connected to the emission control line $EL_{n-1}$. A source electrode S6 of the second emission control TFT T6 is connected to the drain electrode D1 of the driving TFT T1 and the source electrode S3 of the compensation TFT T3. The drain electrode D6 of the second emission control TFT T6 will later be electrically connected to the anode of the OLED. The first emission control TFT T5 and the second emission control TFT T6 are turned on simultaneously by the emission control signal $E_{n-1}$ received through the emission control line $EL_{n-1}$ and apply the first power supply voltage to the OLED.

FIGS. 3 through 6 are schematic plan views respectively illustrating the electrodes included in the pixel 1 of FIG. 2 on different layers. FIG. 7 illustrates the electrodes of FIGS. 3 through 6 which are placed in one pixel. The structure of the LTPS substrate will now be described in greater detail with reference to FIGS. 3 through 7.

A display device may include the display unit 60 located on a substrate. The substrate may be shaped like a rectangular parallelepiped plate. A surface of the substrate may be flat, and various structures that constitute the display unit 60 may be disposed on the flat surface.

Figure 3:
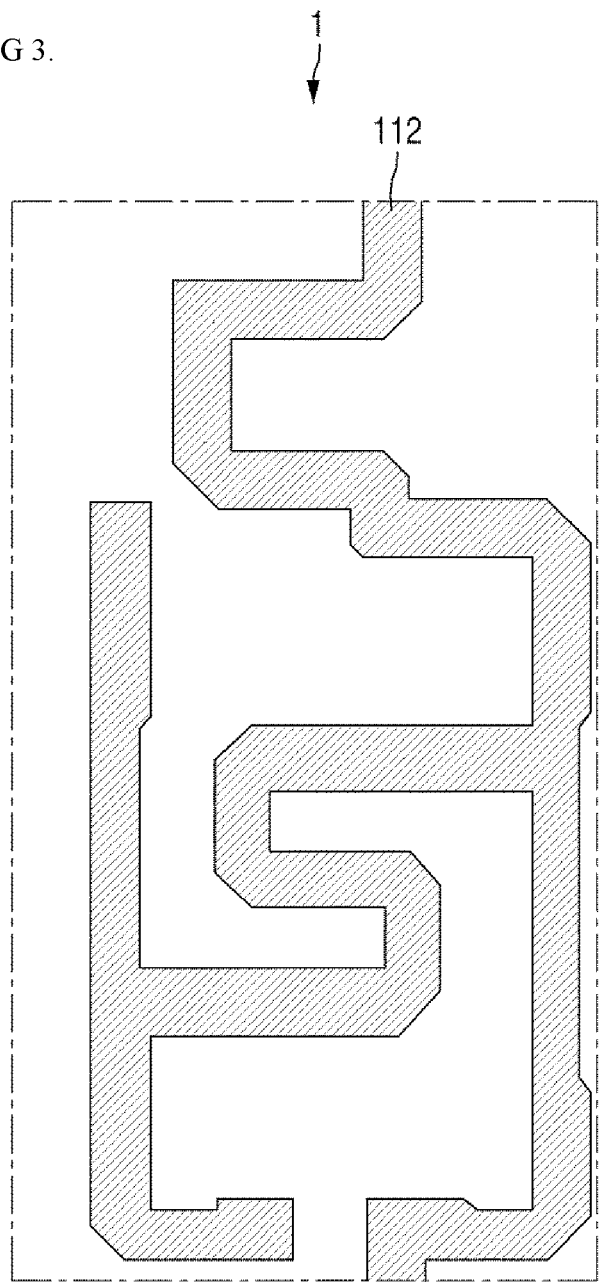
FIGS. 3 through 6 are plan views respectively illustrating different layers of electrodes included in one pixel of the LTPS substrate applied to the organic light-emitting display device.

A buffer layer may be located on the substrate, and an active layer 112 may be disposed on the buffer layer. In FIG. 3, only the active layer 112 disposed on the LTPS substrate is illustrated. The TFTs T1 through T6 (refer to FIG. 2) are provided along the active layer 112, and the active layer 112 is bent in various shapes. In an exemplary embodiment, the active layer 112 includes polysilicon and includes a channel region which is undoped with impurities and a source region and a drain region which are disposed on both sides of the channel region and doped with impurities, for example. In exemplary embodiments, the impurities may vary according to the type of TFT and may be N-type impurities or P-type impurities.

Figure 4:
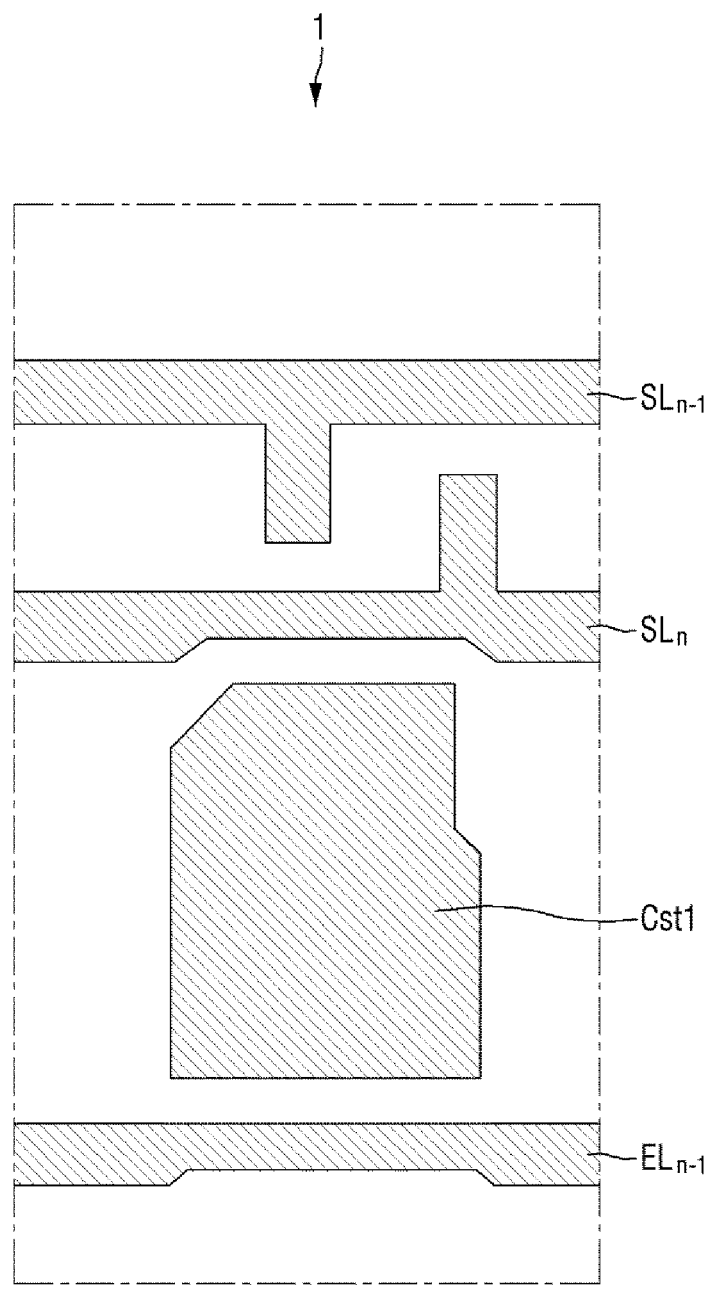

FIG. 4 illustrates the first scan line $SL_n$, the second scan line $SL_{n-1}$, the emission control line $EL_{n-1}$, and the first electrode Cst1 of the capacitor Cst disposed on the active layer 112 of FIG. 3. The first scan line $SL_n$, the second scan line $SL_{n-1}$, the emission control line $EL_{n-1}$, and the first electrode Cst1 of the capacitor Cst may be disposed on the same layer and provided in the same process.

Figure 5:
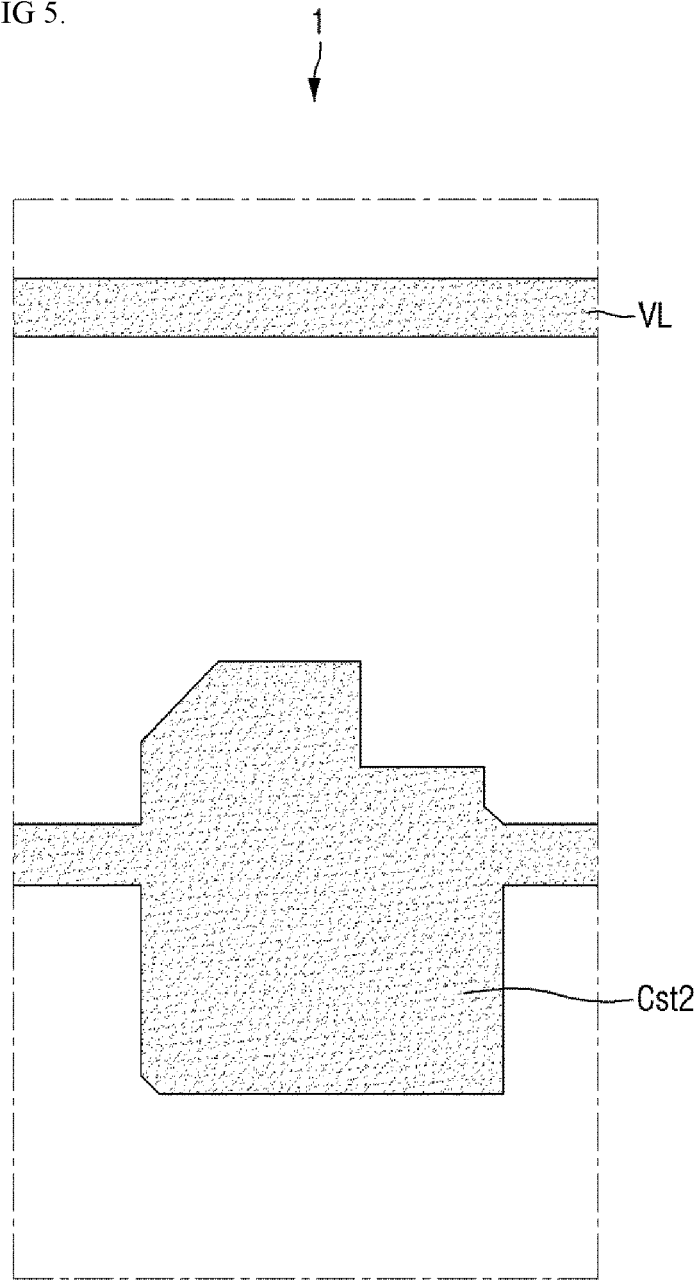

FIG. 5 illustrates a second electrode Cst2 of the capacitor Cst and the initialization voltage line VL. The second electrode Cst2 of the capacitor Cst and the initialization voltage line VL may include the same material on the same layer.

Figure 6:
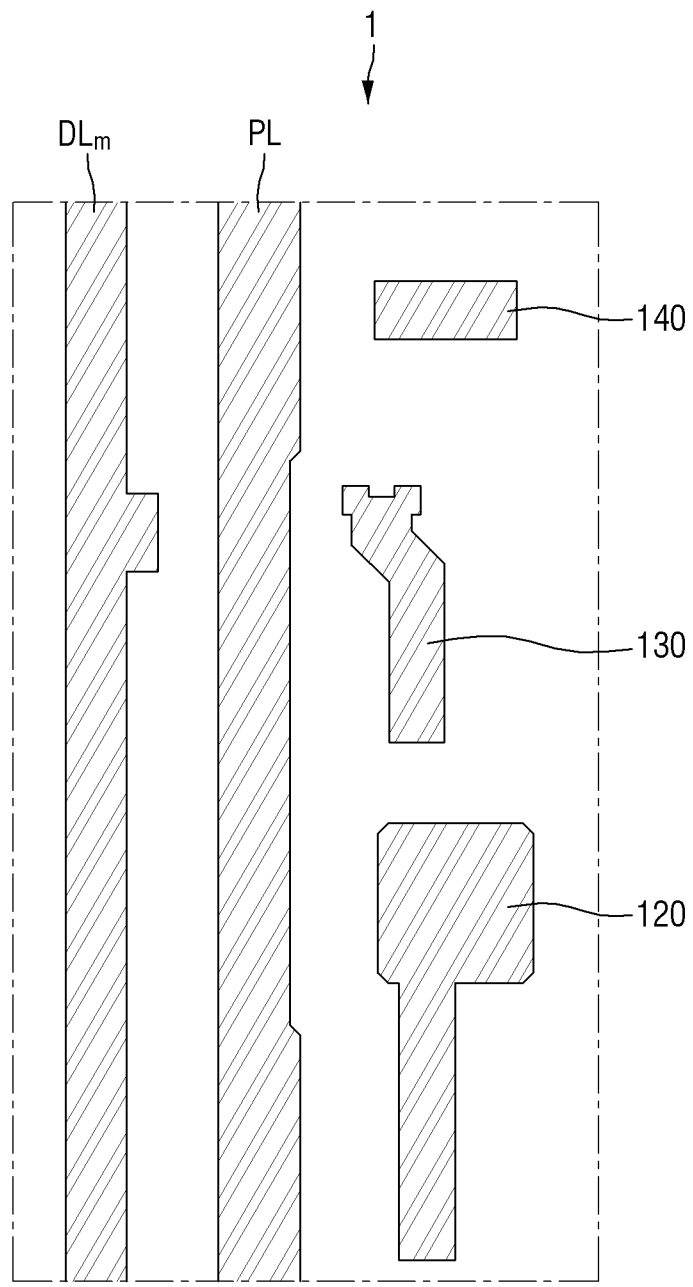
Figure 7:
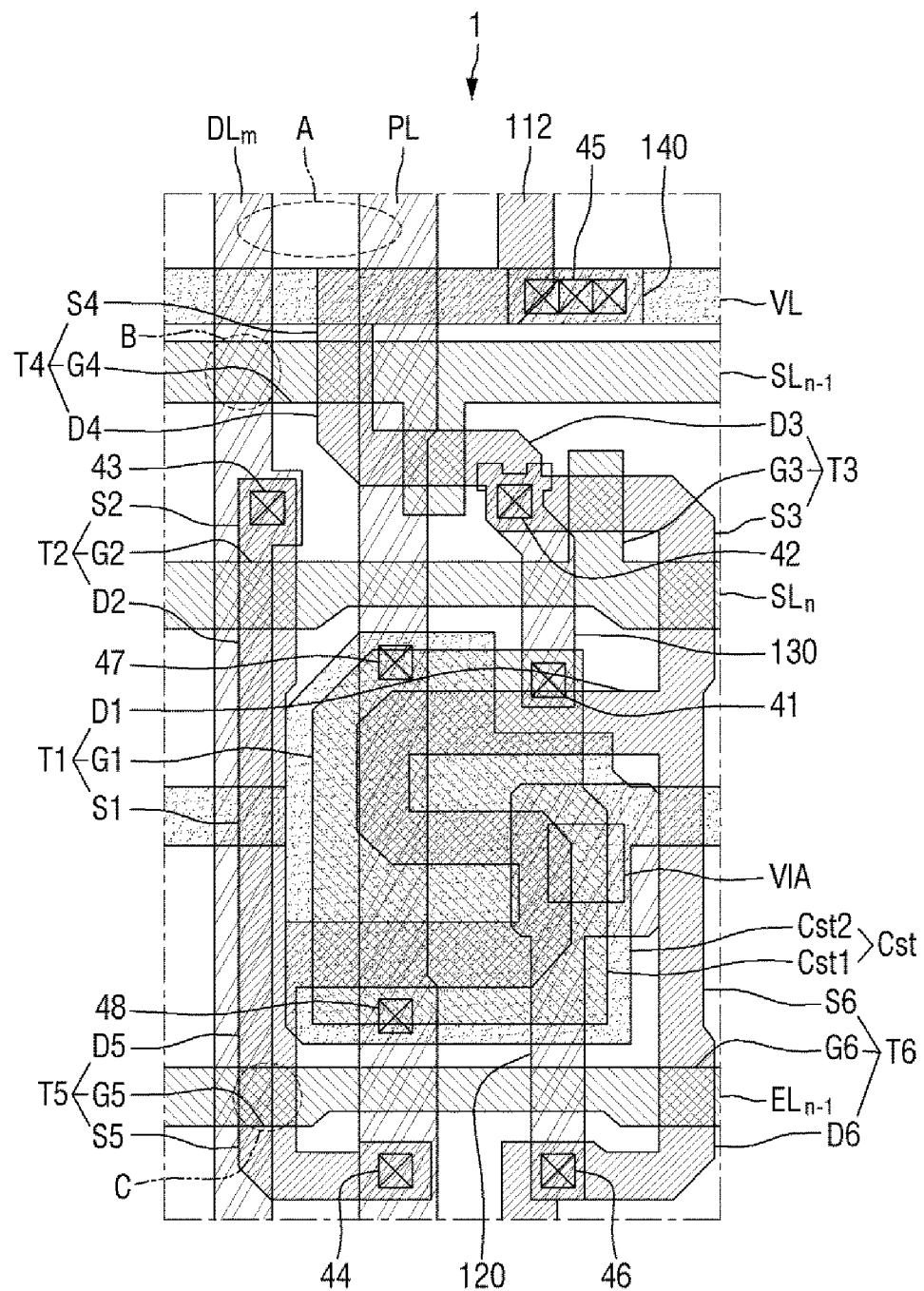
FIG. 7 is a plan view of the electrodes of FIGS. 3 through 6 which are placed in one pixel.

FIG. 6 illustrates the data line $DL_m$, the driving voltage line PL and a first connecting member 120, a second connecting member 130 and a third connection member 140 disposed on the electrodes of FIG. 5. The data line $DL_m$, the driving voltage line PL, and the first connecting member 120, the second connecting member 130 and the third connecting member 140 may include the same material on the same layer.

An interlayer insulating film may be disposed between the electrodes of FIG. 4 and the electrodes of FIG. 5. The interlayer insulating film may also be disposed between the electrodes of FIG. 5 and the electrodes of FIG. 6. In an exemplary embodiment, the interlayer insulating film may include an inorganic insulating material, for example.

Referring to FIG. 7, the driving TFT T1 includes the gate electrode G1, the source electrode S1 and the drain electrode D1. The source electrode S1 corresponds to the source region of the active layer 112 which is doped with impurities, and the drain electrode D1 corresponds to the drain region of the active layer 112 which is doped with impurities. The gate electrode G1 overlaps the channel region. The gate electrode G1 is connected to the first electrode Cst1 of the capacitor Cst, the drain electrode D3 of the compensation TFT T3 and the drain electrode D4 of the initialization TFT T4 by the second connecting member 130 through contact holes 41 and 42. The active layer 112 of the driving TFT T1 is bent. In the example of FIG. 3, the active layer 112 of the driving TFT T1 is bent in an 'S' shape.

The active layer 112 of the driving TFT T1 may also be bent in various shapes such as 'S,' 'N,' and 'W' according to various exemplary embodiments of the invention. The active layer 112 of the driving TFT T1 may have a long channel region. Since the long channel region increases a driving range of a gate voltage, a gray level of light emitted from the OLED may be controlled with greater precision.

The switching TFT T2 includes the gate electrode G2, a source electrode S2 and the drain electrode D2. The source electrode S2 corresponds to the source region of the active layer 112 which is doped with impurities, and the drain electrode D2 corresponds to the drain region of the active layer 112 which is doped with impurities. The gate electrode G2 overlaps the channel region. The source electrode S2 is connected to the data line $DL_m$ through a contact hole 43. The drain electrode D2 is connected to the source electrode S1 of the driving TFT T1 and the drain electrode D5 of the first emission control TFT T5. The gate electrode G2 includes a portion of the first scan line $SL_n$.

The compensation TFT T3 includes the gate electrode G3, the source electrode S3 and the drain electrode D3. The source electrode S3 corresponds to the source region of the active layer 112 which is doped with impurities, and the drain electrode D3 corresponds to the drain region of the active layer 112 which is doped with impurities. The source electrode S3 may be connected to the initialization voltage line VL by the third connecting member 140 through a contact hole 45. The gate electrode G3 overlaps the channel region.

The first emission control TFT T5 includes the gate electrode G5, the source electrode S5, and the drain electrode D5. The source electrode S5 corresponds to the source region of the active layer 112 which is doped with impurities, and the drain electrode D5 corresponds to the drain region of the active layer 112 which is doped with impurities. The gate electrode G5 overlaps the channel region. The source electrode S5 may be connected to the driving voltage line PL through a contact hole 44. The gate electrode G5 includes a portion of the emission control line $EL_{n-1}$.

The first electrode Cst1 of the capacitor Cst is connected to the drain electrode D3 of the compensation TFT T3 and the drain electrode D4 of the initialization TFT T4 by the connecting member 120 which is connected to the contact hole 41. The first electrode Cst1 of the capacitor Cst also serves as the gate electrode G1 of the driving TFT T1. The second electrode Cst2 of the capacitor Cst is connected to the driving voltage line PL through contact holes 47 and 48 and receives the first power supply voltage from the driving voltage line PL.

The first electrode Cst1 of the capacitor Cst is separated from an adjacent pixel, but the second electrode Cst2 of the capacitor Cst is connected to the adjacent pixel. The second electrode Cst2 of the capacitor Cst overlaps the whole of the first electrode Cst1 and perpendicularly overlaps the driving TFT T1. The second electrode Cst2 of the capacitor Cst is connected to the driving voltage line PL through the contact holes 47 and 48 and receives the first power supply voltage from the driving voltage line PL.

The data line $DL_m$ extends in a vertical direction on a left or right side of the pixel 1. The data line $DL_m$ is connected to the switching TFT T2 through the contact hole 43.

The driving voltage line PL extends in the vertical direction on the left or right side of the pixel 1 to be adjacent to the data line $DL_m$. The driving voltage line PL extends in the vertical direction to traverse an area in which the driving TFT T1 and the capacitor Cst are provided. Here, the second electrode Cst2 of the capacitor Cst is electrically connected to the driving voltage line PL by the contact holes 47 and 48 and connected to horizontally adjacent pixels. Therefore, the driving voltage line PL may have a mesh structure connected in the vertical and horizontal directions. The driving voltage line PL is connected to the first emission control TFT T5 through the contact hole 44.

The first connecting member 120 extends from an area in which the drain electrode D6 of the second emission control TFT T6 is provided to the area in which the driving TFT T1 and the capacitor Cst are provided. The first connecting member 120 includes a portion extending parallel to the driving voltage line PL and a portion provided in part of an area in which the driving voltage line PL is separated. A via hole VIA is located in the first connecting member 120 and perpendicularly overlaps part of the driving TFT T1 and part of the capacitor Cst.

The second connecting member 130 is connected to the first electrode Cst1 of the capacitor Cst through the contact hole 41 at an edge of the first electrode Cst1, for example, at a corner of the first electrode Cst1. The second connecting member 130 is connected to the drain electrode D3 of the compensation TFT T3 through the contact hole 42. Accordingly, the second connecting member 130 may connect the capacitor Cst to the compensation TFT T3 and the initialization TFT T4.

The third connecting member 140 may connect the source electrode S4 of the initialization TFT T4 and the initialization voltage line VL through the contact hole 45. In the contact holes 41 through 48 that penetrate the interlayer insulating film, electrodes disposed on and under the interlayer insulating film may contact each other.

FIG. 7 is a plan view illustrating various electrodes of the LTPS substrate of FIGS. 3 through 6 in one pixel. Some factors that may hinder a normal operation in a LTPS manufacturing process will be described with reference to FIG. 7.

In the LTPS manufacturing process, foreign matter may be located between the data line $DL_m$ and the driving voltage line PL in an area A shown in FIG. 7. Alternatively, since the data line $DL_m$ and the driving voltage line PL extend parallel to each other, the data line $DL_m$ and the driving voltage line PL may short-circuit. A data voltage applied to the data line $DL_m$ and a first driving voltage applied to the driving voltage line PL may have different values. However, when the foreign matter located between the data line $DL_m$ and the driving voltage line PL in the area A includes a conductive material, a difference between the data voltage and the first driving voltage is reduced, thus making it impossible for the organic light-emitting display device to appropriately express various gray voltages.

In addition, while the data line $DL_m$ intersects the second scan line $SL_{n-1}$, the data line $DL_m$ is disposed on a different layer from the second scan line $SL_{n-1}$, and the interlayer insulating film is interposed between the data line $DL_m$ and the second scan line $SL_{n-1}$. Therefore, the data line $DL_m$ and the second scan line $SL_{n-1}$ may not be electrically connected to each other at a location B. However, when the data line $DL_m$ and the second scan line $SL_{n-1}$ short-circuit because, e.g., the interlayer insulating film are provided improperly, the organic light-emitting display device may not be driven normally.

Furthermore, while the data line $DL_m$ intersects the emission control line $EL_{n-1}$, the data line $DL_m$ is disposed on a different layer from the emission control line $EL_{n-1}$, and the interlayer insulating film is interposed between the data line $DL_m$ and the emission control line $EL_{n-1}$. Therefore, the data line $DL_m$ and the emission control line $EL_{n-1}$ may not be electrically connected to each other at a location C. However, when the data line $DL_m$ and the emission control line $EL_{n-1}$ short-circuit because, e.g., the interlayer insulating film has been provided improperly, the organic light-emitting display device may not be driven normally.

Figure 8:
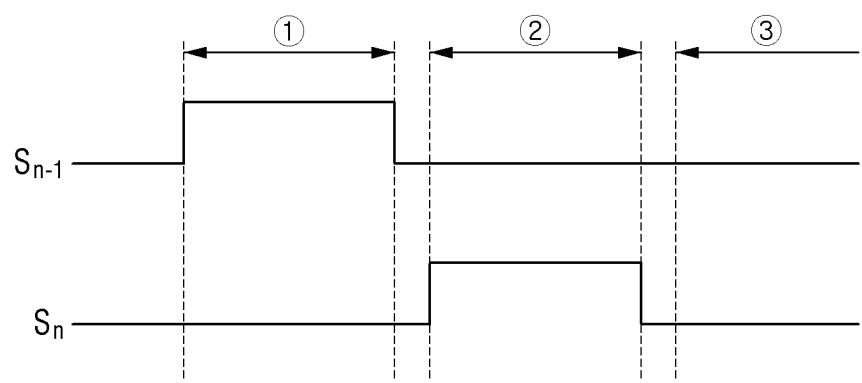
FIG. 8 illustrates a section according to a scan signal in a general organic light-emitting display device.

FIG. 8 is a signal diagram illustrating a method of driving a general organic light-emitting display device. A section 1̂ is an initialization stage. In the section 1̂, the second scan signal $S_{n-1}$ is transmitted to the second scan line $SL_{n-1}$. The second scan signal $S_{n-1}$ causes the initialization voltage Vint to be applied to a pixel, thereby initializing the pixel. Then, in a section 2̂, the first scan signal $S_n$ is transmitted to the first scan line $SL_n$. The first scan signal $S_n$ causes a voltage applied to the data line $DL_m$ to be provided to the drain electrode D2 of the TFT T2. In a section 3̂, the driving TFT T1 is driven by a data signal. Accordingly, the OLED emits light. When a normal data signal is measured in a pixel selected by the first scan line $SL_n$ and the second scan line $SL_{n-1}$ in the section 3̂, the OLED will emit light normally. The array test apparatus and method according to the exemplary embodiment of the invention is an apparatus and method for measuring a data signal value and determining whether the measured data signal value is within a normal range in the section 3̂.

Figure 9:
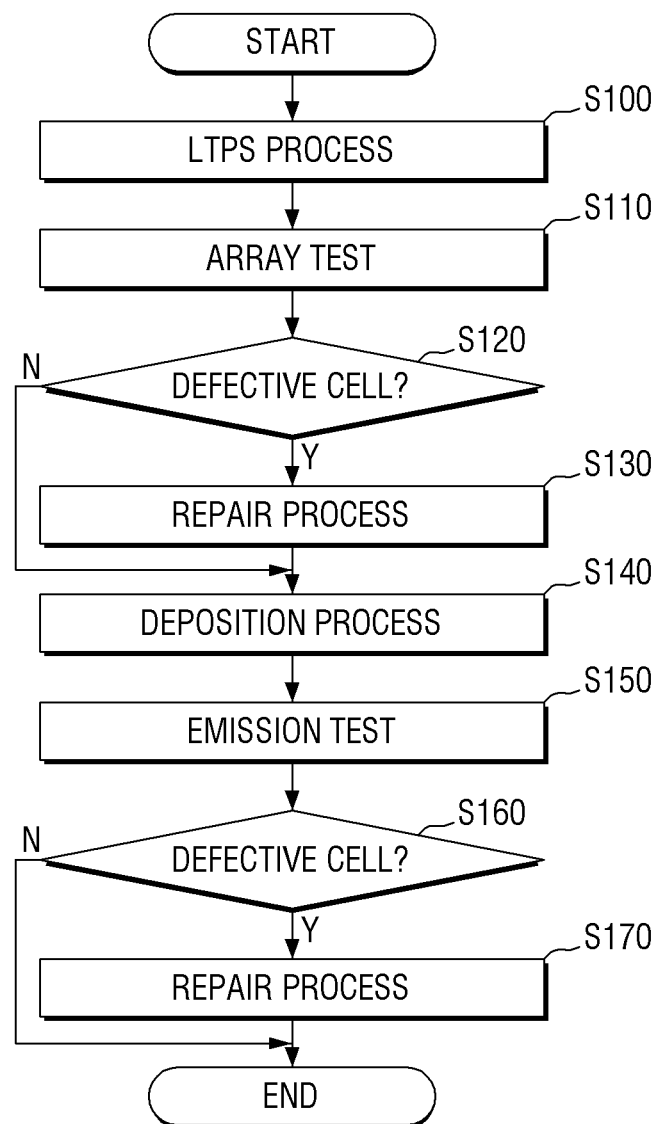
FIG. 9 is a flowchart illustrating a process of manufacturing a general organic light-emitting display device.

FIG. 9 is a flowchart illustrating a time when the array test apparatus and method according to the exemplary embodiment of the invention may be applied in a process of manufacturing an organic light-emitting display device.

The electrodes and insulating layers illustrated in FIGS. 3 through 6 are provided sequentially in an LTPS process (operation S100). After the LTPS process, a voltage is applied through each signal line. After a signal is transmitted to each signal line using the array test apparatus according to the exemplary embodiment of the invention, an array test process may be performed on arrays (operation S110) to determine whether the arrays operate normally.

If defective cells are found in the array test process (operation S110), they are repaired in a repair process (operation S130). Next, a deposition process is performed (operation S140) to form an organic layer, a cathode and an anode, and then an emission test process is performed (operation S150). As in the array test process (operation S110), in the emission test process (operation S150), only defective cells are repaired (operation S170).

The array test process (operation S110) is performed before the deposition of the organic layer. Therefore, whether the data line $DL_m$ operates normally may be determined by applying a data voltage to the data line $DL_m$ in the section 2̂ and then measuring the data voltage applied to the data line $DL_m$ in the section 3̂. A data voltage applied to each pixel 1 is charged in the capacitor Cst until a next scan signal is transmitted to the pixel 1. Therefore, when the data line $DL_m$ is provided normally, a normal data voltage value within a predetermined error range may be measured in the section 3̂ in a pixel to which a data signal has been transmitted.

Figure 10:
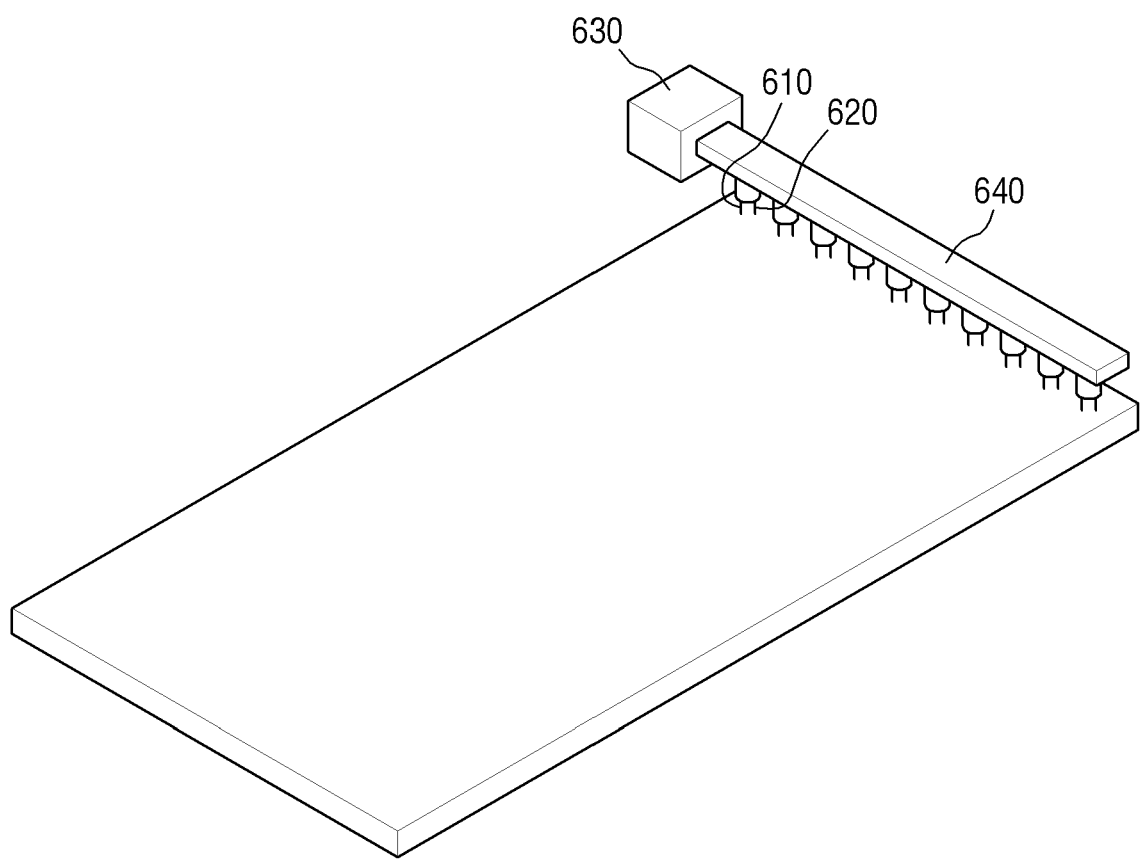
FIG. 10 is a schematic view illustrating an exemplary embodiment of a test operation of an array test apparatus according to the invention on an LTPS substrate.
Figure 11:
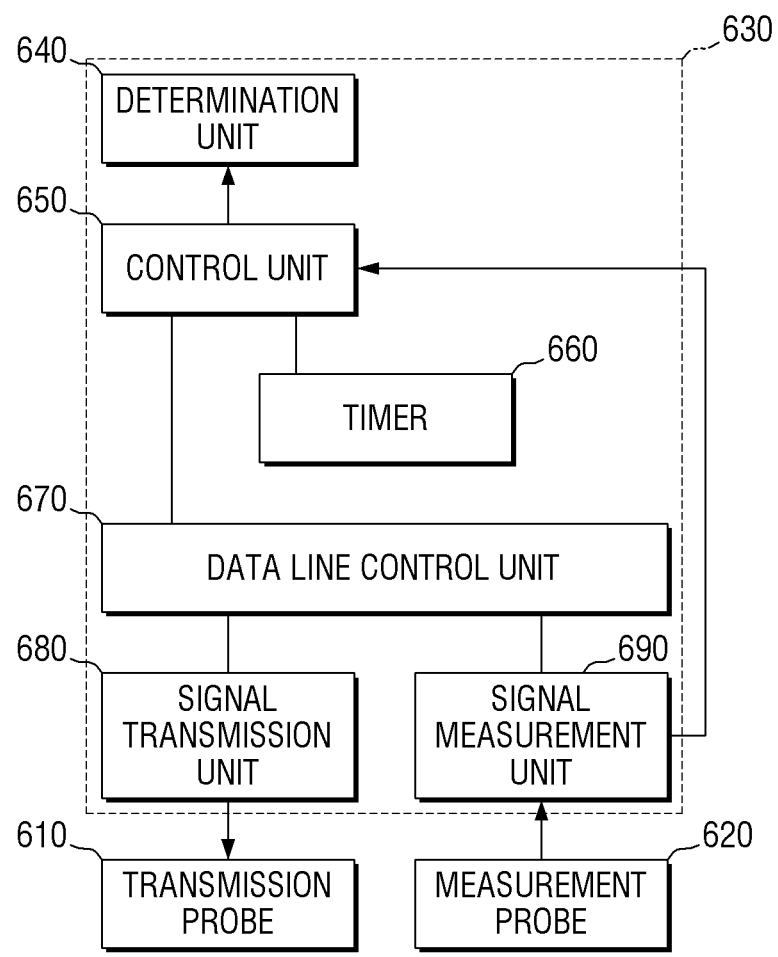
FIG. 11 is a block diagram of the array test apparatus of FIG. 10.

FIG. 10 is a schematic view illustrating a test operation of an array test apparatus according to an exemplary embodiment of the invention. FIG. 11 is a block diagram of the array test apparatus of FIG. 10. The array test apparatus according to the illustrated exemplary embodiment will now be described with reference to FIGS. 10 and 11.

The array test apparatus may be placed on a data pad unit of a display device to perform an array test. The array test apparatus includes two probe pins 610 and 620, a probe bar 640, and an array test system 630. A transmission probe 610 and a measurement probe 620 are placed on the data pad unit from which a plurality of data lines $DL_m$ (refer to FIG. 1) extends to a plurality of pixels 1, respectively. The transmission probe 610 transmits a data signal to each of the data lines $DL_m$, and the measurement probe 610 measures the data signal of each of the data lines $DL_m$. A data line control unit 670 provides the data signal to a signal transmission unit 680 according to a constant clock signal transmitted from a timer 660.

As described above with reference to FIG. 8, a data signal is transmitted to the signal transmission unit 680 in the section 2̂ and then measured by a signal measurement unit 690 in the section 3̂. Therefore, in the array test apparatus, the control unit 650 controls the data line control unit 670 to drive the signal transmission unit 680 or the signal measurement unit 690 according to the constant clock signal transmitted from the timer 660.

The signal transmission unit 680 applies a data voltage to the transmission probe 610. The array test apparatus of the invention may include an equal number of transmission probes 610 to the number of data lines $DL_m$ as illustrated in FIG. 10 or a greater number of transmission probes 610.

An array test apparatus according to another exemplary embodiment of the invention may provide a first data voltage or a second data voltage to each of the data lines $DL_m$, apply a different data voltage to each of the data lines $DL_m$, or provide the first data voltage or the second data voltage according to a synchronization signal.

The array test apparatus according to the another exemplary embodiment of the invention may further include a selection unit (not illustrated) in a control unit 650. The selection unit (not illustrated) may select one of the first data voltage and the second data voltage. Each of the first data voltage and the second data voltage may be direct current ("DC") power, and the value of the DC power may be changed by a clock signal. The selection unit (not illustrated) selects whether to apply the first data voltage or the second data voltage to each of the data lines $DL_m$ at a current clock time. While a signal measurement unit 690 measures data signals using a measurement probe 620 at the current clock time, the selection unit (not illustrated) may select whether to apply the first data voltage or the second data voltage to each of the data lines $DL_m$ at a next clock time.

A signal transmission unit 680 of an array test apparatus according to another exemplary embodiment of the invention may transmit alternating current ("AC") power to a plurality of data lines $DL_m$ through a plurality of transmission probes 610, respectively. A method of the array test apparatus according to the another exemplary embodiment of the invention will be described later with reference to FIGS. 16 and 17.

A determination unit 640 receives, from the control unit 650, information about whether the first data voltage or the second data voltage has been applied to each of the data lines $DL_m$. That is, the determination unit 640 receives, from the control unit 650, matching information between each of the data lines $DL_m$ and a data voltage applied to the data line $DL_m$. When data voltages are applied, the determination unit 640 may store an average value a of data signal values measured by the signal measurement unit 690. When a data signal value measured at a current clock time is within a predetermined threshold range Th (refer to FIG. 13) from the average value a, the determination unit 640 determines the data signal value to be normal. Conversely, when a data signal value measured at the current clock time is outside the predetermined threshold range Th from the average value a, the determination unit 640 determines the data signal value to be abnormal.

The determination unit 640 of the array test apparatus according to the another exemplary embodiment of the invention may update the average value a based on data signal values newly measured at each clock. Since a resistance value between the transmission probe 610 and the measurement probe 620 and the substrate changes, the average value a may be updated to reflect the change in the resistance value. Here, the average value a may be calculated and updated using only data signal values determined to be normal.

In the array test apparatus according to the another exemplary embodiment of the invention which selects one of the first data voltage and the second data voltage and applies the selected data voltage, the determination unit 640 may store an average value a of data signals measured when the first data voltage was applied and an average value a of data signals measured when the second data voltage was applied. When updating the average value a, the determination unit 640 may receive, from the control unit 650, information about whether data signal values are values measured when the first data voltage was applied or values measured when the second data voltage was applied.

A method of determining a defective cell and detecting the location of the defective cell using an array test method according to an exemplary embodiment of the invention will now be described in detail with reference to FIGS. 12 through 18.

As illustrated in FIG. 10, an array test apparatus is placed on a data pad unit from which a plurality of data lines $DL_m$ of an LTPS substrate extends. Here, a scan signal $S_n$ is transmitted to a scan line $SL_m$ of the LTPS substrate by a separate probe or a driver.

Figure 12:
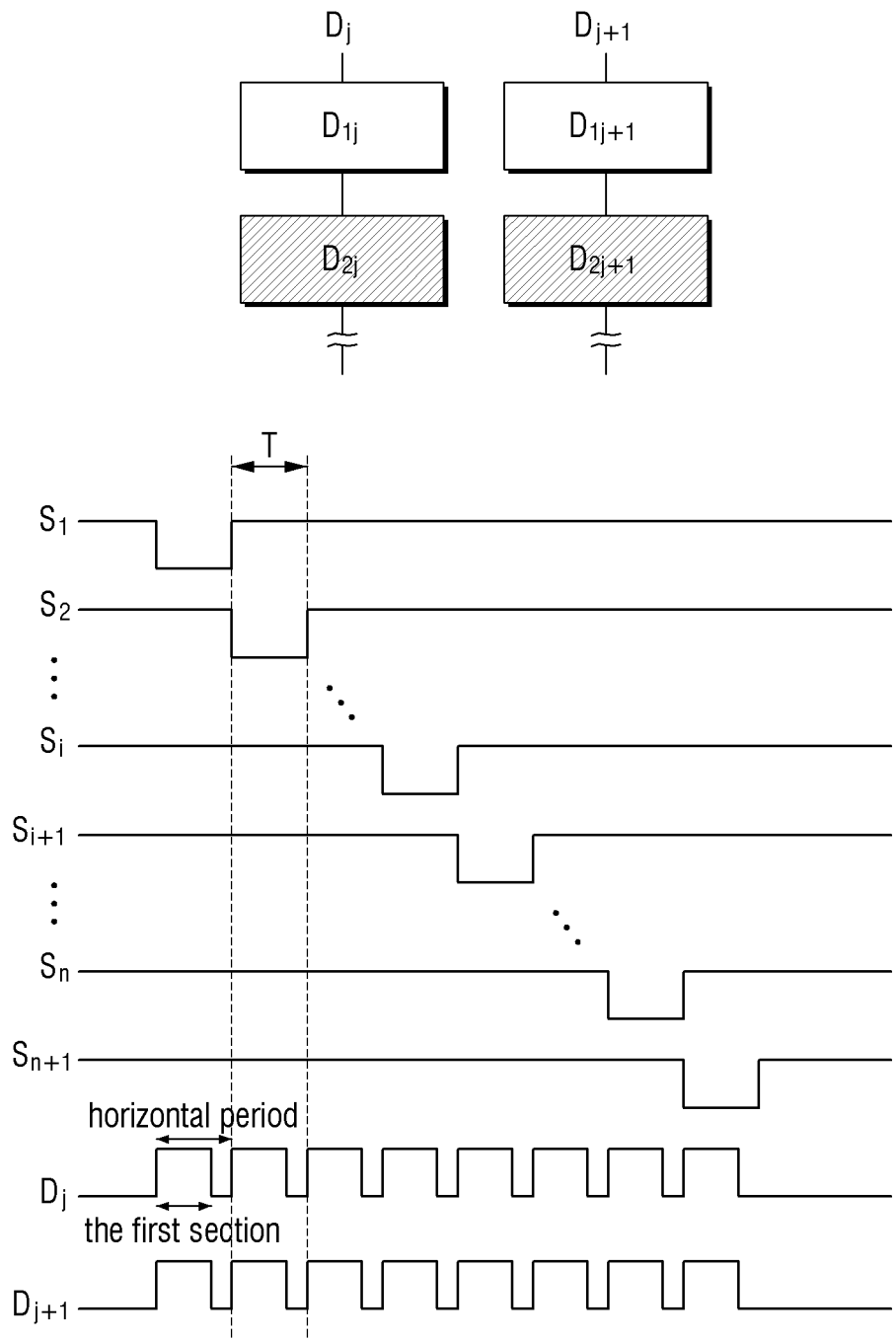
FIGS. 12 through 18 are signal diagrams of exemplary embodiments of a process of applying and measuring data signals in array tests according to the invention.

FIG. 12 is a signal diagram illustrating data voltages applied to transmission probes 610 according to a scan signal. In FIG. 12, a plurality of scan signals $S_1$ through $S_{n+1}$ is sequentially transmitted in each predetermined period. In a T section illustrated in FIG. 12, the scan signal S2 is transmitted. In response to the scan signal S2, switching TFTs T2 of pixels 1 (refers to FIGS. 1 and 2) located in a second row are turned on from among a plurality of pixels 1 connected to a plurality of data lines $DL_m$. Accordingly, the pixels 1 located in the second row receive data voltages.

In the exemplary embodiment of FIG. 12, data voltages may be applied respectively and constantly to the data lines $DL_m$ in each horizontal period. The horizontal period refers to the T section in which any one of the scan signals $S_1$ through $S_{n+1}$ is transmitted.

In the array test method according to the illustrated exemplary embodiment, constant DC data voltages are applied to the data lines $DL_m$. Data signals measured after an array test according to an exemplary embodiment may be as illustrated in FIG. 13.

Figure 13:
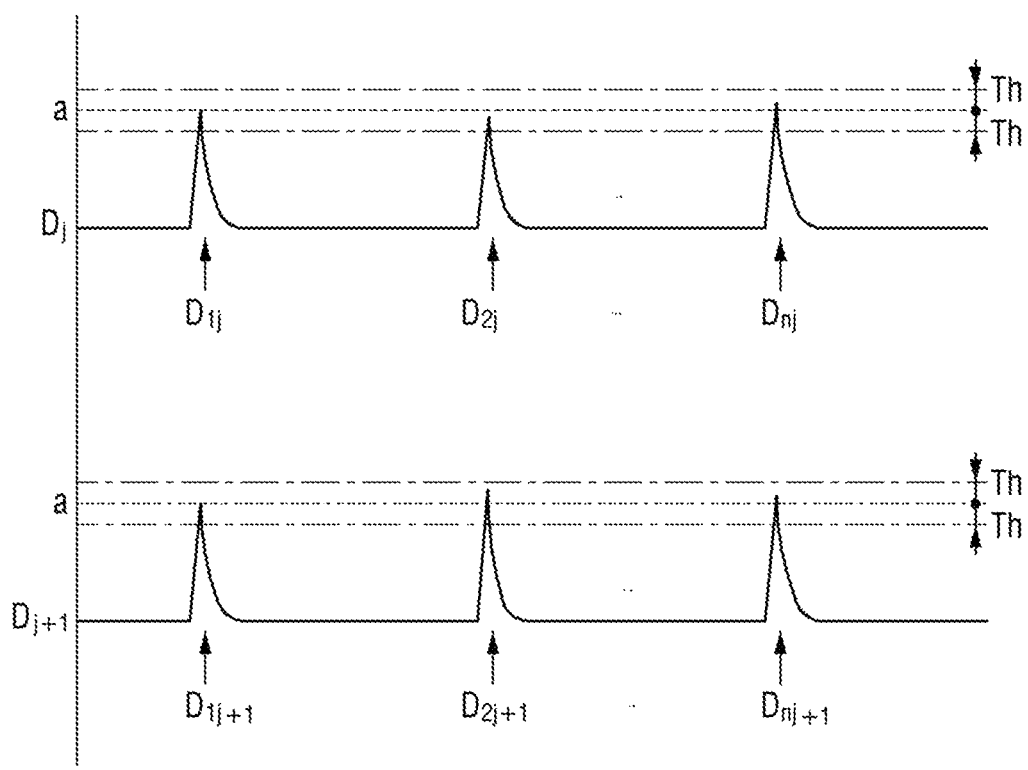

Referring to FIG. 13, in the array test method according to the illustrated exemplary embodiment, a pixel corresponding to a data signal $D_{1j}$ is determined to be a normal pixel because a measured data signal is within a predetermined threshold range Th from an average value a. The pixel corresponding to the data signal $D_{1j}$ is determined to be an abnormal pixel when the measured data signal is outside predetermined threshold range Th from the average value a. Since the data lines $DL_m$ and scan lines $SL_n$ intersect each other in a matrix pattern, the location of an abnormal pixel 1 in the matrix pattern may be detected using a measured abnormal data signal value.

As illustrated in FIGS. 12 and 13, the signal transmission unit 680 of an array test apparatus according to an exemplary embodiment of the invention applies a data voltage to each of the data lines $DL_m$ for a first section, and the signal measurement unit 690 of the array test apparatus measures the data voltage of each of the data lines $DL_m$ for the remaining period of the horizontal period after the first section. Even when data voltages are not applied to the data lines $DL_m$, data voltages applied to a row of pixels to which a scan signal has been transmitted are charged in capacitors Cst of the pixels. Therefore, the data voltages charged in the capacitors Cst may be measured in the data lines $DL_m$ for a period of time remaining after the first section is excluded from the horizontal period. Whether an array operates normally may be determined based on values of the measured data voltages.

Figure 14:
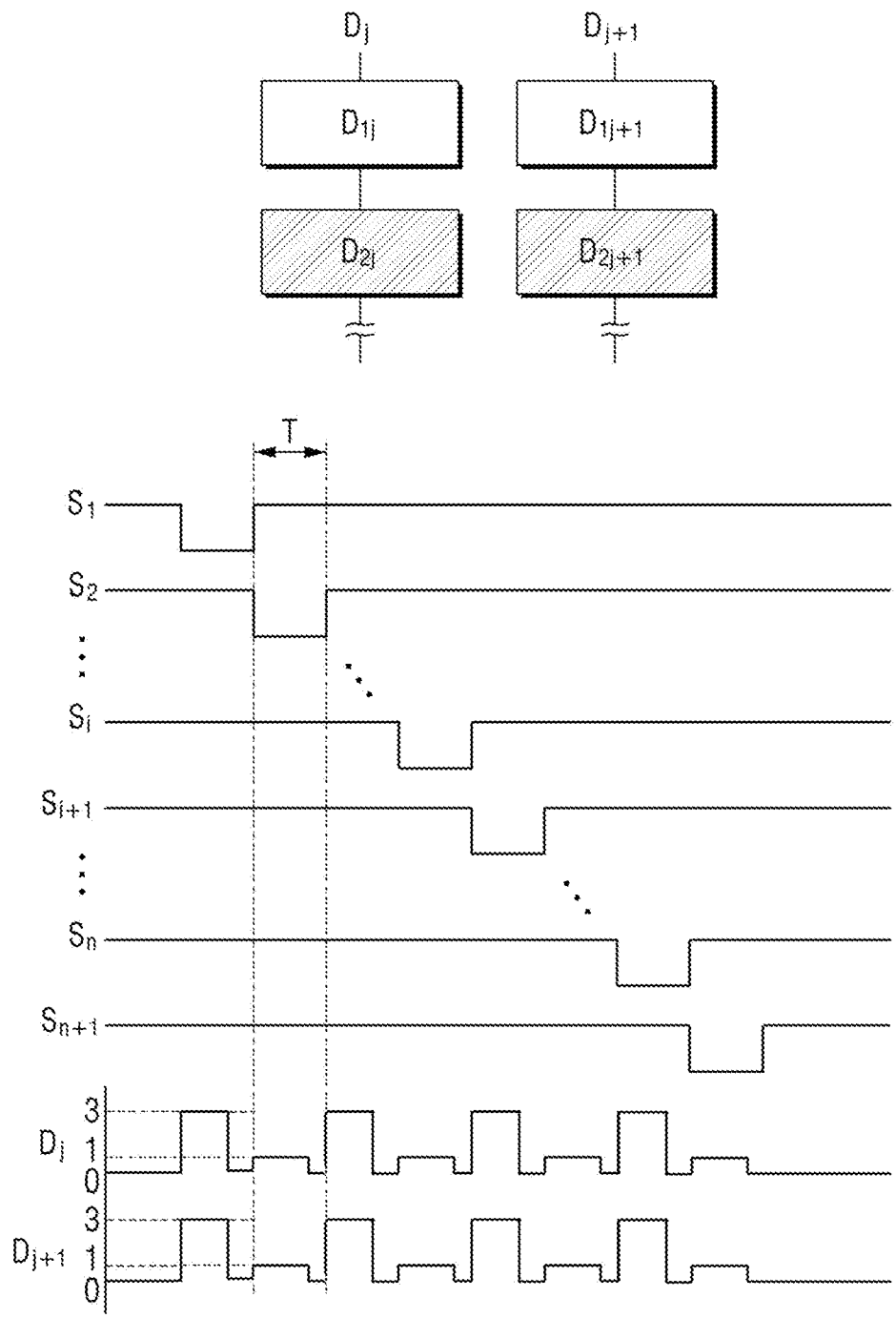
Figure 15:
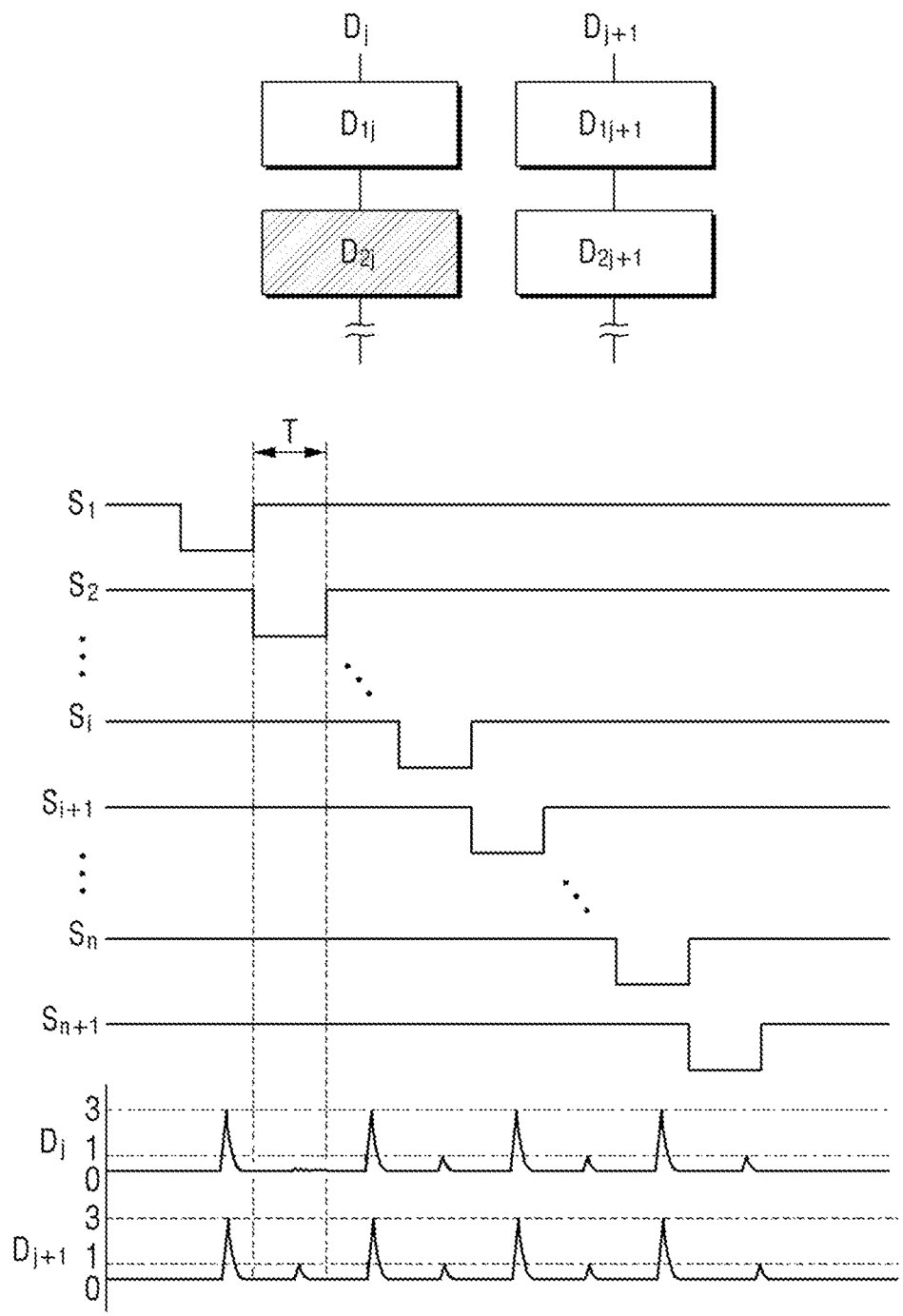

FIGS. 14 and 15 illustrate result values obtained by applying and measuring data voltages using an array test method according to another exemplary embodiment of the invention.

In FIG. 14, as in FIG. 12, a scan signal $S_n$ is transmitted to a different scan line $SL_n$ in each horizontal period. In the exemplary embodiment of FIG. 14, unlike in FIG. 12, any one of a first data voltage and a second data voltage is applied to each data line in each horizontal period. The first data voltage and the second data voltage have different values.

When the first data voltage and the second data voltage are alternately applied in each horizontal period as in FIG. 14, conductive foreign matter in an area A of FIG. 7, a short circuit between a data line $DL_m$ and the driving voltage line PL, a short circuit between the data line $DL_m$ and the second scan line $SL_{n-1}$ in an area B, or a short circuit between the data line $DL_m$ and the emission control line $EL_{n-1}$ in an area C may be additionally detected. Referring to the layout of the LTPS substrate in FIG. 7, the second electrode Cst2 of the capacitor Cst is connected to pixels 1 on both sides and receives the first driving voltage through the driving voltage line PL and the contact holes 47 and 48. Therefore, it is as when the driving voltage line PL actually had a mesh structure. In this case, when a constant voltage is applied to the data line $DL_m$ in each horizontal period as in the array test method according to the exemplary embodiment of FIG. 12, the short circuit or foreign matter between a portion of the data line $DL_m$ and the driving voltage line PL, the second scan line $SL_{n-1}$ or the emission control line $EL_{n-1}$ may not be detected. This is because data voltages from the pixels 1 located on both sides may be measured in the data line $DL_m$. Therefore, it is difficult to determine whether a measured data signal is normal due to the normal pixel or due to data signals from the pixels 1 on both sides.

To solve the above problem, different data voltages are applied to adjacent pixels in FIG. 14. In this case, the probability that a defective pixel 1 is wrongly determined to be a normal pixel 1 due to data signals from adjacent signals may be reduced.

When a pixel corresponding to a data signal $D_{2j}$ is a defective pixel in which a short circuit occurs between a data line $DL_m$ and the driving voltage line PL, between the data line $DL_m$ and the second scan line $SL_{n-1}$ or between the data line $DL_m$ and the emission control line the defective pixel may not be detected using the array test method of FIG. 12 but may be detected using the array test method of FIG. 14.

FIG. 15 illustrates values of data signals measured in the data lines $DL_m$ in each horizontal period after the data signals are transmitted to the data lines $DL_m$ according to the array test method of FIG. 14. Since the pixel corresponding to the data signal $D_{2j}$ is a defective pixel, it shows a different waveform from that of a data signal $D_{2j+1}$. A pixel corresponding to the data signal $D_{2j}$ may be determined to be a defective pixel based on the different wavelength.

Figure 16:
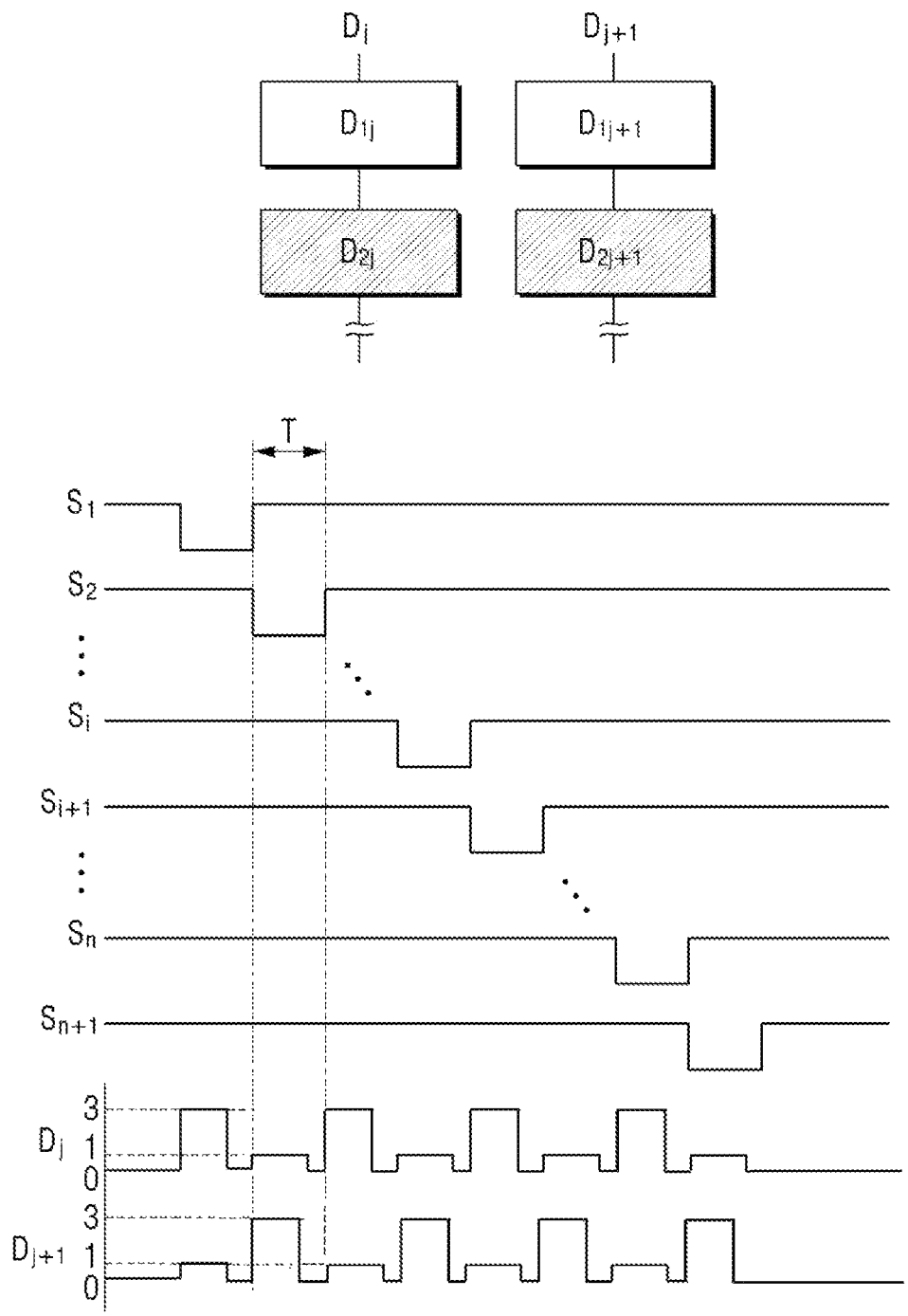

FIG. 16 illustrates an array test method according to another exemplary embodiment of the invention. In the array test method according to the illustrated exemplary embodiment, when a first data voltage is applied to a $j^{th}$ data line $DL_j$ from among a plurality of data lines $DL_m$, a data voltage applied to each of a $(j-1)^{th}$ data line $DL_{j-1}$ and a $(j+1)^{th}$ data line $DL_{j+1}$ may be a second data voltage. Therefore, it is possible to prevent normal data voltages from being leaked from normal pixels located on both sides of a defective pixel and then measured in a data line that provides a data voltage to the defective pixel. As a result, the defective pixel may be detected.

Figure 17:
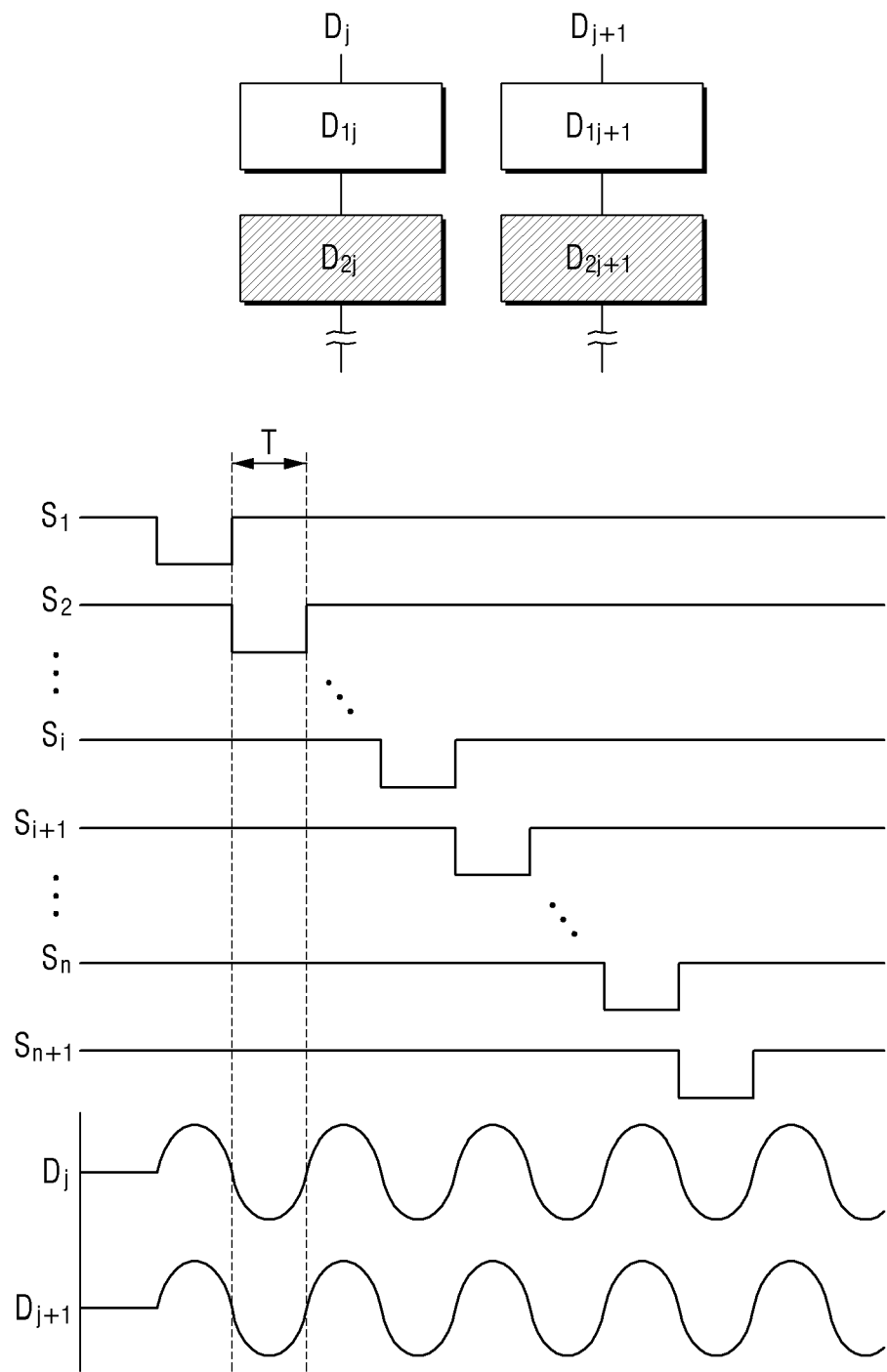
Figure 18:
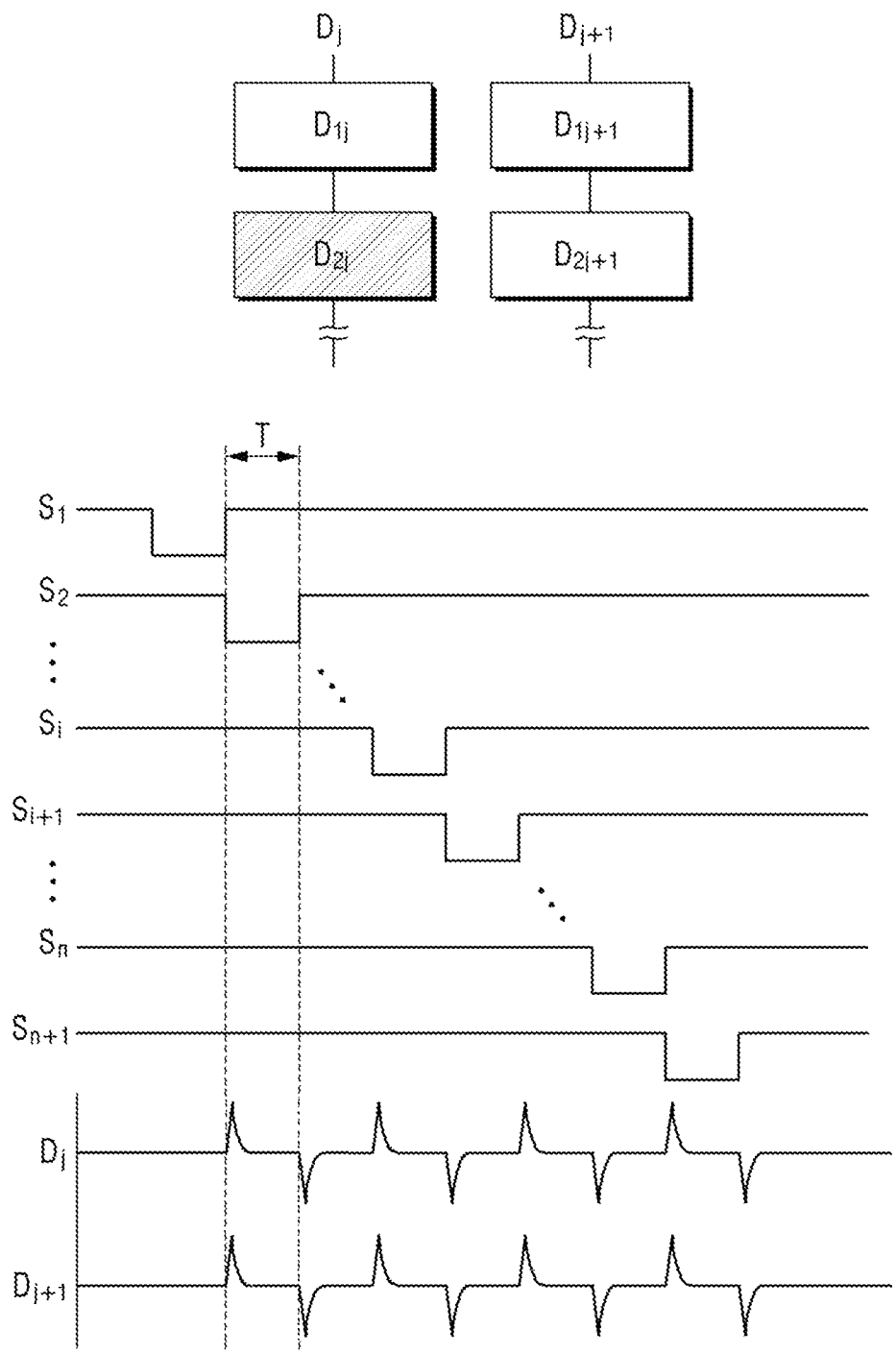

FIGS. 17 and 18 illustrate result values obtained by applying and measuring data voltages using an array test method according to another exemplary embodiment of the invention.

In the array test method according to the illustrated exemplary embodiment, AC power is supplied to each data line $DL_m$. An electric potential of the AC power may be changed every horizontal period. Therefore, when voltages applied to pixels in an $i^{th}$ row have a positive (+) electric potential, voltages applied to pixels in an $(i+1)^{th}$ row may have a negative (−) electric potential. Accordingly, a phase of an electric potential of a voltage measured in each data line $DL_m$ may be changed according to an electric potential of a voltage applied as in FIG. 18.

In a case where the AC power is used as in the array test method of FIGS. 17 and 18, when an electric potential of a voltage applied to each pixel is changed from + to − or from − to +, the signal measurement unit 690 may measure a data signal of each data line $DL_m$.

Exemplary embodiments of the invention provide at least one of the following advantages.

An array test apparatus according to exemplary embodiments of the invention performs a repair process before the formation of organic light-emitting diodes.

The array test apparatus according to the exemplary embodiments of the invention easily repairs a signal line which has been cut or short-circuited by detecting the location of the signal line.

However, the effects of the invention are not restricted to the one set forth herein. The above and other effects of the invention will become more apparent to one of daily skill in the art to which the invention pertains by referencing the claims.

What is claimed is:

1. An array test apparatus comprising:
   a signal transmission unit which transmits a data signal to each of a plurality of data lines of a low-temperature polysilicon substrate;
   a signal measurement unit which measures the data signal of each of the plurality of data lines of the low-temperature polysilicon substrate;
   a timer which generates a horizontal period for setting a section in which the data signal is transmitted from the signal transmission unit to each of the plurality of data lines and a section in which the data signal output from each of the plurality of data lines is measured by the signal measurement unit;
   a determination unit which determines whether each of the plurality of data lines of the low-temperature polysilicon substrate is normal based on the data signal measured by the signal measurement unit;
   a transmission probe which delivers a data signal transmitted from the signal transmission unit to each of the plurality of data lines; and
   a measurement probe which delivers the data signal measured in each of the plurality of data lines to the signal measurement unit,
   wherein the transmission probe and the measurement probe are placed above the plurality of data lines of the low-temperature polysilicon substrate to perform an array test.

2. The apparatus of claim 1, wherein the data signal transmitted to each of the plurality of data lines is one of a first data voltage and a second data voltage, wherein the first data voltage and the second data voltage have different values.

3. The apparatus of claim 2, further comprising a selection unit which selects whether the data signal to be transmitted to each of the plurality of data lines is one of the first data voltage and the second data voltage.

4. The apparatus of claim 2, wherein the low-temperature polysilicon substrate further comprises a plurality of scan lines which intersect the plurality of data lines, and the horizontal period is a period of time during which a scan signal is transmitted to one of the plurality of scan lines on the low-temperature polysilicon substrate.

5. The apparatus of claim 4, further comprising a selection unit which selects one of the first data voltage and the second data voltage in each horizontal period.

6. The apparatus of claim 4, wherein when determining a measured data signal to be abnormal, the determination unit detects a location of an abnormal pixel based on a location of a data line in which the abnormal data signal was measured and a location of a scan line to which the scan signal was transmitted.

7. The apparatus of claim 6, wherein the determination unit stores an average value of the measured data signals and determines a data signal measured by the signal measurement unit to be normal when the measured data signal is within a predetermined threshold range from the stored average value and determines the data signal measured by the signal measurement unit to be abnormal when the measured data signal is outside the predetermined threshold range from the stored average value.

8. The apparatus of claim 7, wherein when data signals measured in each horizontal period are normal, the determination unit updates the average value of the measured data signals by including the data signals.

9. The apparatus of claim 1, wherein the signal transmission unit transmits an alternating current data signal.

10. The apparatus of claim 9, wherein the signal measurement unit measures the alternating current data signal when a phase of the alternating current data signal is changed.

11. An array test apparatus comprising:
- a signal transmission unit which transmits a data signal to each of a plurality of data lines of a low-temperature polysilicon substrate;
- a signal measurement unit which measures the data signal of each of the plurality of data lines of the low-temperature polysilicon substrate;
- a timer which generates a horizontal period for setting a section in which the data signal is transmitted from the signal transmission unit to each of the plurality of data lines and a section in which the data signal output from each of the plurality of data lines is measured by the signal measurement unit; and
- a determination unit which determines whether each of the plurality of data lines of the low-temperature polysilicon substrate is normal based on the data signal measured by the signal measurement unit,
- wherein the signal transmission unit transmits data signals in a first section of the horizontal period, and the signal measurement unit measures the data signals in a section remaining after the first section is excluded from the horizontal period.

* * * * *